United States Patent [19]

Ohashi

[11] Patent Number: 4,737,640
[45] Date of Patent: Apr. 12, 1988

[54] ELECTRON MICROSCOPE

[75] Inventor: Toshiyuki Ohashi, Katsuta, Japan

[73] Assignee: Hitachi, Ltd., Tokyo, Japan

[21] Appl. No.: 849,836

[22] Filed: Apr. 9, 1986

[30] Foreign Application Priority Data

Apr. 10, 1985 [JP] Japan ................................. 60-76080

[51] Int. Cl.⁴ ............................................. H01J 37/26
[52] U.S. Cl. ................................. 250/311; 250/306; 250/397
[58] Field of Search ...................... 250/311, 397, 306

[56] References Cited

U.S. PATENT DOCUMENTS 3,833,811  9/1974  Koiake et al. ................ 250/311
3,917,946  11/1975  Van Oostrum .................. 250/311
4,091,374  5/1978  Müller et al. ................... 250/311
4,097,740  6/1978  Müller et al. ................... 250/311
4,618,766  10/1986  Van der Mast et al. .......... 250/311

Primary Examiner—Bruce C. Anderson
Attorney, Agent, or Firm—Antonelli, Terry & Wands

[57] ABSTRACT

An electron microscope provided with a wobbler device forms a magnified image of a specimen on a fluorescent panel therein. This magnified image is displayed on a monitor by means of a television camera. The microscope is provided with a synchronizer for allowing the wobbler device to change deflection angles of a beam of electrons in synchronism with a synchronizing signal for the monitor.

5 Claims, 2 Drawing Sheets

ELECTRON MICROSCOPE

FIELD OF THE INVENTION

The present invention relates to an electron microscope. More particularly, the present invention pertains to an electron microscope having an electron microscope main body provided with a wobbler device, and a television (hereinafter referred to as "TV") camera adapted for sensing or picking up a magnified image of a specimen formed on a fluorescent panel in the microscope main body and for displaying this image on a monitor.

BACKGROUND OF THE INVENTION

When a specimen is observed using an electron microscope (i.e., an electron microscope main body, which will be generally referred to simply as "electron microscope", hereinafter), it is general practice to pick up a magnified image of a specimen formed on a fluorescent panel in the microscope by a TV camera. This is effected for the purpose of converting information concerning the specimen into electric signals for effecting picture processing. In addition, this imaging operation is carried out for the purpose of adjusting the focus of the microscope in the case of photographically recording a magnified image which is discernible to the naked eye because the irradiation dose is minimized in order to suppress the generation of damage to the specimen.

When a magnified image obtained by an electron microscope is picked up by a TV camera for the purpose of effecting focusing, it is conventional practice to experientially make a judgement by examining the extent to which the magnified image is out of focus, or the change of a Fresnel fringe of the magnified image, i.e., a kind of interference fringe which is formed by a beam of electrons reflected from an edge portion of the specimen. However, the Fresnel fringe is not necessarily formed by any kind of specimen but appears depending upon the kind of specimen. In addition, it is difficult to make a judgement as to whether or not the microscope is in focus from the extent to which the magnified image is out of focus. When an out-of-focus image is photographically recorded, the extent to which the image is out of focus is enhanced. Therefore, if the focus of the microscope is not satifactorily adjusted when a magnified image which is picked up by a TV camera is observed, an image which is more out of focus is recorded on a picture.

A wobbler device has heretofore been employed in an electron microscope for the purpose of facilitating the adjustment of focus. The wobbler device is based on the principle that, as the incident angle at which an electron beam is applied to a specimen increases, the focal depth of an objective lens becomes smaller. More specifically, the wobbler device changes the direction in which an electron beam enters a specimen so as to increase the apparent incident angle, thereby enlarging the aperture of the electron beam with respect to the incident direction of the electron beam, and thus facilitating the focus adjustment by means of the objective lens. The wobbler device has already been disclosed in, e.g., the specification of Japanese Patent Laid-Open No. 30154/1977.

However, when an electron microscope provided with a wobbler device and a TV camera of the type described above are combined together, the following problems may arise. Namely, the TV camera successively scans over the imaging surface to obtain a picture signal. Therefore, when the wobbler device is operated during the imaging operation by the TV camera in order to change the incident direction of the electron beam, if the speed at which the deflection angles are changed over by the wobbler device is excessively high, images may undesirably overlap or lie one upon another while one frame is being replaced by another, which means that it is difficult to effect the focus adjustment.

SUMMARY OF THE INVENTION

Accordingly, it is a primary object of the present invention to provide an electron microscope which employs a wobbler device and a monitor in combination and which is so designed to facilitate the adjustment of focus.

To this end, the present invention provides an electron microscope having an electron microscope main body provided with a wobbler device, and a TV camera adapted for picking up a magnified image of a specimen formed on a fluorescent panel in the microscope main body and for displaying the magnified image on a monitor, wherein the wobbler device changes deflection angles of a beam of electrons in synchronism with a synchronizing signal from the monitor, whereby at least two picture images obtained on the monitor by changing the deflection angles can be changed over one from another in synchronism with the synchronizing signal, so that, when the picture on the monitor is scanned by the TV camera, the scanning by the TV camera and the timing at which the two picture images on the monitor are changed over are synchronized with each other.

By virtue of the above-described arrangement, it is possible to prevent two picture images on the monitor from being offset from each other or from overlapping each other, which phenomena might otherwise occur due to the fact that deflection angles are changed over by the wobbler device at an excessively high speed, so that it is possible to facilitate the focus adjustment by means of an objective lens.

BRIEF DESCRIPTION OF THE DRAWINGS

FIG. 2 shows an example in which the image of a specimen is displayed on the screen of a monitor by employing a wobbler device in such a manner that the image is divided into two, upper and lower, portions along the horizontal direction of the monitor screen, in which.

FIG. 3 shows an example in which the image of the specimen is displayed on the screen of the monitor by employing the wobbler device in such a manner that the image is divided into two, right and left, portions along the vertical direction of the monitor screen, in which FIG. 4 shows an example in which the image of the specimen is displayed on the screen of the monitor by employing the wobbler device in such a manner that the image is divided into two portions along a diagonal direction of the monitor screen, in which

DETAILED DESCRIPTION OF THE PREFERRED EMBODIMENT

Figure 1:
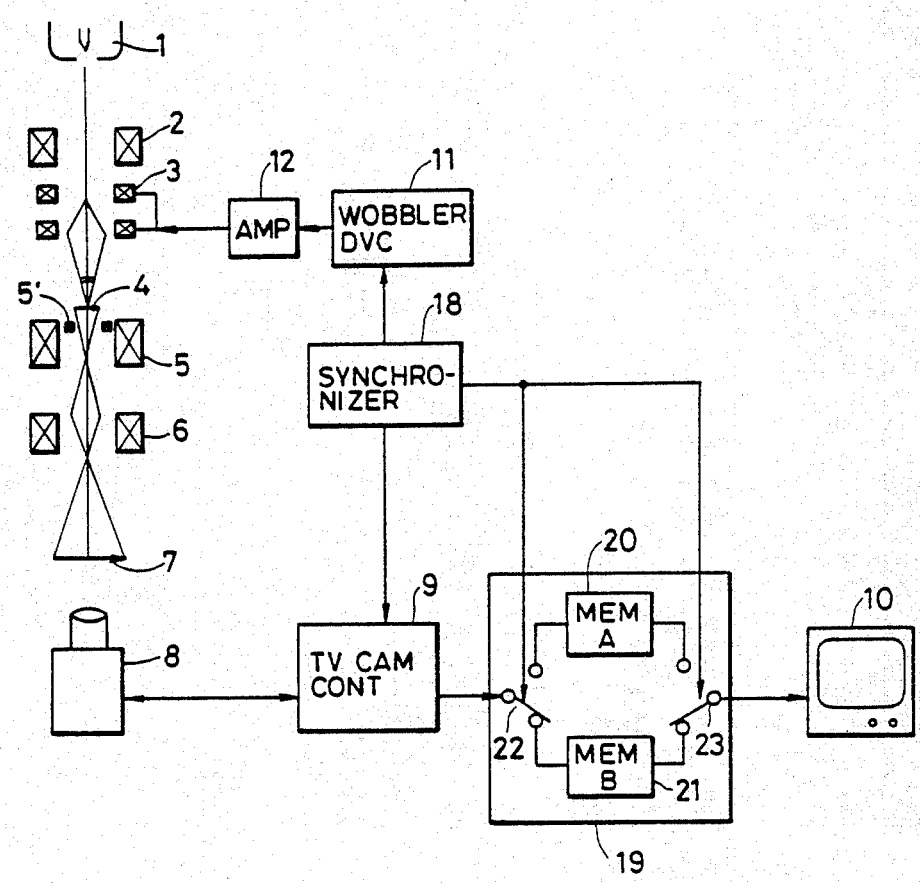
FIG. 1 shows the arrangement of one embodiment of the electron microscope according to the present invention.

Referring first to FIG. 1, the reference numeral 1 denotes an electron gun, 2 a converging lens, 3 a deflecting coil, 4 a specimen, 5 an objective lens, 6 an image forming lens, 7 a fluorescent panel, 8 a TV camera, 9 a TV camera controller, 10 a monitor, 11 a wobbler device, 12 a current amplifier, and 5' an astigmatism correction coil.

A first feature of the present invention resides in providing a synchronizer 18 for allowing the TV camera controller 9 and the wobbler device 11 to be operated synchronously with each other, in addition to the arrangement shown in FIG. 1.

A second feature of the present invention resides in providing a picture memory 19 for eliminating the effect of persistence on the monitor. This picture memory 19 includes a memory A 20 for recording images 13A, 16A and 27A respectively shown in FIGS. 2B, 3B and 4B, and a memory B 21 for recording images 13B, 16B and 27B respectively shown in FIGS. 2B, 3B and 4B. The memories A 20 and B 21 are connected in parallel to switches 22 and 23. The switches 22 and 23 which are respectively connected to the input and output terminals of the memories A 20 and B 21 are actuated so that either the memory A 20 or the memory B 21 is selected, in response to a command from the synchronizer 18. The switching speed of the switch 22 is set so as to be lower than that of the switch 23.

In this electron microscope, a beam of electrons emitted from the electron gun 1 is converged on the surface of the specimen 4 by the converging lens 2, and the brightness of the image of the specimen 4 is controlled. The image of the specimen 4 is magnified and formed on the fluorescent panel 7 by the objective lens 5 and the image forming lens 6. The magnified image formed on the fluorescent panel 7 is picked up by the TV camera 8. The TV camera controller 9 delivers a scanning signal to the TV camera 8. The controller 9 also amplifies the obtained picture signal, thus displaying the magnified image on the monitor 10.

The wobbler device 11 is connected to the deflecting coil 3 through the current amplifier 12 and is also connected to the TV camera controller 9. The wobbler device 11 counts the number of horizontal synchronizing signals delivered from the TV camera controller 9 and changes the timing at which a pair of images 13A, 13B (16A, 16B; or 27A, 27B) which are respectively and alternately displayed in the halved screen areas of the monitor 10 are changed over from one to the other, in response to a command from the synchronizer 18. A horizontal synchronizing signal which is delivered from the TV camera controller 9 when one frame is completed is returned to the initial position on the TV camera 8. The output of the TV camera controller 9 is amplified by the current amplifier 12 and is then supplied to the deflecting coil 3 to change the incident direction of the electron beam.

Figure 2A:
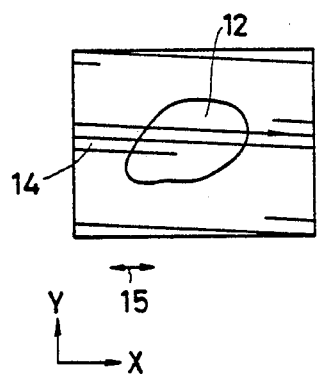
FIG. 2A shows the image after the focus has been adjusted.
Figure 2B:
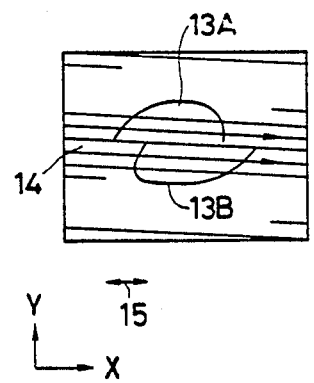
FIG. 2B shows the image before the adjustment of the focus.

FIG. 2 shows the image thus obtained and displayed on the monitor 10. The upper and lower halves of the frame displayed on the screen of the monitor 10 are formed in such a manner that the electron beam is wobbled by the wobbler device 11 at substantially the same deflection angle in symmetry with respect to the electron beam. The reference numerals 13A and 13B denote image portions formed by wobbling the electron beam, while the numeral 12 denotes an image obtained after the focus has been adjusted. The numeral 14 denotes horizontal scanning lines, and the arrow 15 indicates the incident direction of the electron beam. FIG. 2A shows a case where the microscope is in focus, while FIG. 2B shows a case where the microscope is out of focus. More specifically, the change in the incident direction of the electron beam is effected in a moment. Therefore, when the microscope is in focus, the two, upper and lower, image portions are aligned with each other as shown in FIG. 2A, whereas, when the microscope is out of focus, the upper and lower image portions are off-set from each other as shown in FIG. 2B. In the latter case, the objective lens 5 is adjusted so that the image on the screen of the monitor 10 becomes such as that shown in FIG. 2A, whereby the focus of the microscope is adjusted.

It is to be noted that the reference symbols X and Y in the figures denote the horizontal and vertical directions, respectively.

When the scanning direction of the monitor 10 and the direction in which the electron beam is deflected by the wobbler device 11 are coincident with each other (e.g., the horizontal direction), the offset between the two image portions on the screen of the monitor 10 becomes maximum.

Figure 3A:
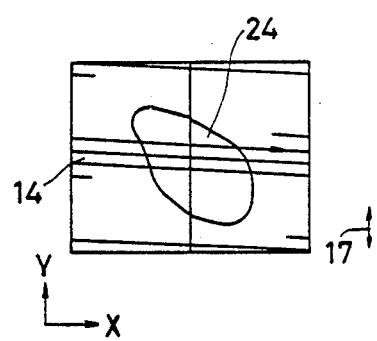
FIG. 3A shows the image after the focus has been adjusted.
Figure 3B:
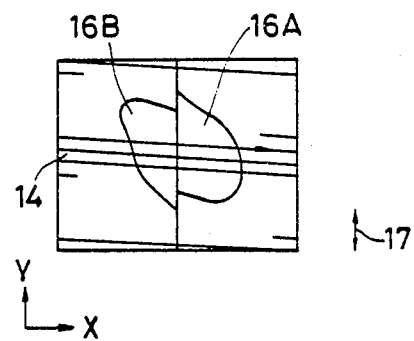
FIG. 3B shows the image before and adjustment of the focus.

Referring now to FIG. 3, the reference numerals 24 and 16 (16A and 16B) denote the images of a specimen, while the numeral 14 denotes horizontal scanning lines, and the arrow 17 indicates the direction in which the electron beam is deflected by the wobbler device 11. The image 24 shown in FIG. 3A represents the fact that the microscope is in focus, while FIG. 3B shows a case where the microscope is out of focus.

In this example, the direction in which the frame displayed on the monitor screen is divided by changing deflection angles using the wobbler device is perpendicular to the incident direction of the electron beam.

Figure 4A:
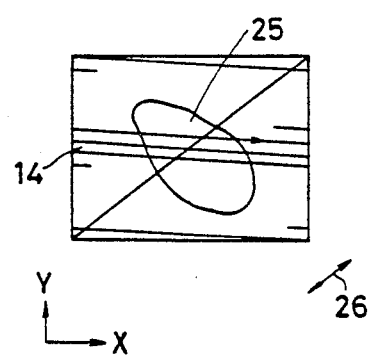
FIG. 4A shows the image after the focus has been adjusted.
Figure 4B:
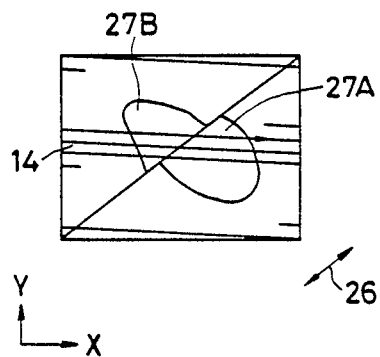
FIG. 4B shows the image before the adjustment of the focus.

FIG. 4 shows an example in which two diagonally divided image portions are obtained by combining horizontal and vertical synchronizing signals. The image 25 shown in FIG. 4A represents the fact that the microscope is in focus, while FIG. 4B shows a case where the microscope is out of focus.

Specimens generally have various configurations, and each specimen, therefore, has its own direction in which it is easy to observe the offset between two image portions obtained when the wobbler device 11 is operated. Accordingly, if the arrangement is such that it is possible to select a direction in which the monitor screen area is divided and an incident direction of the electron beam in accordance with each kind of specimen, the adjustment of focus can readily be effected in any case. In addition, if, for example, the monitor screen area dividing direction is successively changed between the X- and Y-directions, it becomes easy to effect correction of any directional defocusing, i.e., the astigmatism correction. Astigmatism correction can be effected by the astigmatism correction coil 5'.

As has been described above, the electron microscope in accordance with this embodiment enables the focus adjustment to be readily effected simply by adjusting the objective lens so that offset image portions on the screen of the monitor are aligned with each other.

What I claim is:

1. An electron microscope comprising:

an electron microscope main body including a wobbler device for obtaining an image of a specimen constituted by at least two image portions on a screen of a monitor by alternately changing deflection angles of a beam of electrons in said microscope and for allowing the focus of said microscope to be adjusted by aligning said two image portions into one complete image;

a television camera for picking up a magnified image of a specimen formed on a fluroescent panel by said electron beam and for displaying said magnified image on said monitor in response to a scanning signal from a television camera controller; and synchronizer means for synchronizing said scanning signal from said television camera controller with a change over from a first one of said at least two image portions to a second one of said at least two image portions for display on said monitor;

said television camera controller delivering at least two picture signals to said monitor through a number of memories which corresponds to the number of picture signals;

a switch being provided at input and output terminals of said memories, respectively, and being responsive to a command from said synchronizer means, for switching between said memories in synchronism with the change over from said first one of said at least two image portions to said second one of said at least two image portions.

2. An electron microscope according to claim 1, wherein said synchronizer means actuates each switch such that the speed at which the switch at the input terminal of said memories is actuated so as to select one of said memories is lower than the speed at which the switch at the output terminal of said memories is actuated so as to select one of said memories.

3. An electron microscope according to claim 1, wherein said synchronizer means outputs a control signal for controlling said scanning signal and an image display changeover signal such that said image of the specimen is divided into upper and lower, image portions along the horizontal direction on the screen of said monitor.

4. An electron microscope according to claim 1, wherein said synchronizer means outputs a control signal for controlling said scanning signal and an image display changeover signal such that said image of the specimen is divided into right and left, image portions along the vertical direction on the screen of said monitor.

5. An electron microscope according to claim 1, wherein said synchronizer means outputs a control signal for controlling said scanning signal and an image display changeover signal such that said image of the specimen is divided into two image portions along a diagonal direction on the screen of said monitor.

* * * * *